(12) United States Patent
Valentian

(10) Patent No.: US 7,683,653 B2
(45) Date of Patent: Mar. 23, 2010

(54) PROCESS AND CIRCUIT FOR IMPROVING THE LIFE DURATION OF FIELD-EFFECT TRANSISTORS

(75) Inventor: Alexandre Valentian, Saint Egreve (FR)

(73) Assignee: Commissariat a l'Energie Atomique (FR)

( * ) Notice: Subject to any disclaimer, the term of this patent is extended or adjusted under 35 U.S.C. 154(b) by 257 days.

(21) Appl. No.: 12/024,518

(22) Filed: Feb. 1, 2008

(65) Prior Publication Data

US 2008/0186049 A1 Aug. 7, 2008

(30) Foreign Application Priority Data

Feb. 2, 2007 (FR) .................... 07 53039

(51) Int. Cl.
*H03K 19/00* (2006.01)
(52) U.S. Cl. ........................................ 326/16
(58) Field of Classification Search .................. 326/16
See application file for complete search history.

(56) References Cited

U.S. PATENT DOCUMENTS

2006/0158210 A1 7/2006 Tsai et al.
2006/0223201 A1* 10/2006 Liu et al. .................... 438/10
2008/0116455 A1* 5/2008 Jain et al. ................... 257/48

OTHER PUBLICATIONS

Authors: A. Hakan Baba, Subhasish Mitra, Title: Testing for transistor aging, Date: Oct. 2009, Publisher: IEEE, Edition: 27th IEEE VLSI Test symposium, Pertinent pp. 215-220.*

Erhong Li et al.; "Projecting Lifetime of Deep Submicron Mosfets". IEEE Transactions on Electron Devices, IEEE Service Center, Pisacataway, NJ, US, vol. 48, No. 4, Apr. 2001, XP011017570, ISSN: 0018-9383.
U.S. Appl. No. 11/939,946, filed Nov. 14, 2007, Alexandre Valentian (Not Yet Published).
James Stathis: "Gate Oxide Reliability for nanoscale CMOS", International Symposium on Phyiscal and Failure Analysis, pp. 127-130, Jun. 2005.
H. Kawaguchi et al., "A super Cut-Off CMOS (SCCMOS), Scheme for 0.5 V Supply Voltage with Picoampere Stand-by Current", IEEE Journal of Solid State Circuits, vol. 35 N° 10, pp. 1498-1501, Oct. 2000.
Depas et al. "Soft Breakdown of Ultra-thin Gate Oxide Layers", IEEE Transactions on Electron devices vol. 43, No. 3, Sep. 1996.
M.A. Khalil, et al. "Extreme-Voltage Stress Vector Generation of Analog CMOS ICs for Gate-Oxide Reliablity Enhancement," Int. Test Conference, pp. 348-357, 2001.
Z. Han et al. entitled "Gate leak current simulation by Boltzman Transport Equation and its dependence on the gate oxide thickness", International conference on Semiconductor Processes and devices SISPAD, pp. 247-250, Sep. 1999.

* cited by examiner

*Primary Examiner*—Rexford N Barnie
*Assistant Examiner*—Thienvu V Tran
(74) *Attorney, Agent, or Firm*—Lowe Hauptman Ham & Berner, LLP

(57) ABSTRACT

The invention concerns a process and a circuit designed to improve the life duration of electronic field-effect integrated circuit transistors and in particular those with a thin film gate dielectric. According to the invention, an aging measurement ts is supplied by measuring the charge or discharge time at a reference voltage $V_{REF}$ of the gate of a field effect transistor T1, previously pre-charged to a predefined test voltage $V_P$, and brought to high impedance. Depending on the aging measurement obtained, the operational voltage measurement conditions of the transistor can be maintained or modified to reduce the stress applied to the dielectric.

20 Claims, 5 Drawing Sheets

PROCESS AND CIRCUIT FOR IMPROVING THE LIFE DURATION OF FIELD-EFFECT TRANSISTORS

RELATED APPLICATIONS

The present application is based on and claims priority from French Patent Application No. 07 53039, filed Feb. 2, 2007, the disclosure of which is hereby incorporated by reference herein in its entirety.

FIELD OF THE INVENTION

The present invention concerns a process and a circuit designed to improve the life duration of electronic field-effect integrated circuit transistors and in particular those with a thin film dielectric gate.

In applications for which the supply comes from a battery or a storage cell, for instance, in telephones and laptop computers, or in digital cameras, and for all fast electronics applications, it is particularly advantageous to use low-consumption compact transistors with high operating frequencies. Field-effect transistors offer these properties, especially MOS (Metal/Oxide/Semiconductor) and CMOS (Complementary MOS) transistors. These technologies have developed from one generation to another, resulting in ever-smaller geometrical sizes with a proportional decrease in threshold and power supply voltages and increased operating rates.

DISCUSSION OF THE BACKGROUND

Nevertheless, the reduction in geometrical sizes has resulted in an exponential increase in leak currents between source and drain, also referred to as below-threshold currents, present even when the transistor is cut off: for the latest sub-micron generations, this leak current has become a source of energy loss that cannot be left out of account.

Therefore, it has become necessary to decrease the effect of these leak currents, meaning reducing the power supply voltages and transistor threshold voltages to a smaller proportion. The direct consequence of this is that the electric field applied across the terminals of the gate dielectric is greater. This exposes the dielectric to greater stress, in particular at the point where the gate overhangs the drain and/or source. if we consider the example of an NMOS transistor, in the conducting state, its drain and gate are polarized at Vdd and its source at Vm. If we refer to the two logic power supply voltage levels as being Vdd and Vm as illustrated in FIG. 1a: the dielectric is affected by a stress at the point where the gate overhangs the source. In the cut-off state, the gate is brought to Vm while the polarization of the drain and source remain unchanged as illustrated in FIG. 1b: The dielectric is affected by a stress at the point where the gate overhangs the drain. For a PMOS transistor, the position of drains d and sources s is reversed in the figures.

However, the recent predictions published in the document by James Stathis: "Gate Oxide Reliability for nanoscale CMOS", International Symposium on Physical and Failure Analysis, pp 127-130, June 2005, demonstrate that by reducing the size of the transistors, a gate dielectric will tolerate an electrical field across its terminals of around 1 V per nanometer of thickness.

Accordingly, reliability is decreased in thin dielectric transistors used in logic circuits, especially fast logic circuits, powered by a polarizing voltage at their gates, source and drain, corresponding to the logic supply voltage levels of the circuit.

The stress affecting the gate dielectric is increased even more in the power transistors used in the analog stages of electronic circuits, controlled by higher voltages than at the logic power supply voltage, causing these transistors to become highly conductive or highly cut-off. For instance, let us consider the power transistors used as power supply cut-off devices for all or part of an electronic circuit in stand-by mode to reduce the stand-by mode leak current. SCCMOS ("Super Cut-off CMOS") transistors are an example of the transistors used for this kind of function. A description is to be found in particular in the following publication: H. Kawaguchi et al., "A super Cut-Off CMOS (SCCMOS), Scheme for 0.5 V Supply Voltage with Picoampere Stand-by Current", IEEE Journal of Solid State Circuits, vol. 35 N° 10, pp 1498-1501, October 2000. They are characterised by their capability of conducting high current in the conductive mode, low leak current in the cut-off state, for an optimal occupied circuit area (with respect to the current in the conductive state).

For this kind of use, in stand-by mode, the transistor is blocked and the transistor gate is inverse "super-polarised", producing leak current beneath the minimum threshold. In reality, the leak current below the threshold decreases exponentially when more negative polarization is applied to the gate for an NMOS or more positive polarization for a PMOS. Inverse super-polarization refers to the polarization of the gate at a lower voltage than the most negative terminal of the logic supply voltage of the circuit for an NMOS transistor or higher than the most positive supply terminal of the logic supply voltage for a PMOS circuit.

This mode of inverse polarization produces increased stress in the gate dielectric, in the example, more specifically at the point where the gate overhangs the drain so that the drain gate voltage becomes greater than the logic supply voltage. This results in the reduction of the power transistor reliability.

Accordingly, generally speaking, the "miniaturisation" of field-effect transistors reduces their reliability and subsequently the duration of electronic integrated circuits using this type of transistor. This means that the stakes are high, especially for fast logic and for every type "portable" application.

One objective of the present invention is to increase the reliability of field-effect transistors in this way.

It has been seen that in thin dielectric arrangements, stress does not generate the abrupt breakdown of the dielectric as occurs in thicker dielectrics but, on the contrary, leads to a phenomenon of soft breakdown. This phenomenon of soft breakdown is explained in the following publication: Depas et al. "Soft Breakdown of Ultra-thin Gate Oxide Layers", IEEE Transactions on Electron devices Vol. 43, no. 3, September 1996. It is illustrated in FIG. 2, using the example of an MOS technology transistor on a silicon substrate and having a silicon oxide gate dielectric. The ordinates represent the gate voltage which is applied to maintain constant current through the dielectric. Initially, the applied voltage decreases slowly: this part of the curve up to the SBD point corresponds to the generation of faults (carrier traps) in the SiO2 dielectric and at the substrate/dielectric Si/SiO2 interface due to the tunnel injection of electrons in a strong electric field. When, locally, these faults reach sufficient density, a conduction path is formed: this is the first breakdown (SBD point in the figure). This initial breakdown can be followed by other breakdowns. When the conduction path or paths are widened by thermal effects and join one another, the rate of change of the current through the dielectric becomes very high until the transistor switches out (BD point).

The soft breakdown phenomenon as observed allows the detection or following of the aging of the dielectric, before reaching the final breakdown point BD.

SUMMARY OF THE INVENTION

The idea behind the intervention is somehow to detect the SBD point of the curve, so that the transistor polarization conditions can be adapted to reduce slightly the stress applied to the dielectric. In fact, the life duration of a dielectric varies exponentially with the applied stress: as explained in the document published by M. A. Khalil, et Al, *"Extreme-Voltage Stress Vector Generation of Analog CMOS ICs for Gate-Oxide Reliability Enhancement," Int. Test Conference*, pp. 348-357, 2001, the life duration $t_{BD}$ of a field-in effect transistor for a given technology is defined in the following equation:

$$t_{bd} = \tau_0 \cdot e^{\frac{G \cdot T_{\mathit{eff}}}{V_{OX}}},$$

in which $t_{BD}$ ("time to breakdown") is the intrinsic life duration of the dielectric exposed to the voltage $V_{ox}$; $T_{\mathit{eff}}$ is the effective thickness of the dielectric; $V_{ox}$ is the effective voltage across the terminals of the dielectric; G is the slope of the logarithmic curve having duration $t_{BD}$ depending on $1/E_{ox}$, where $E_{ox}$ is the electric field in the dielectric.

In an example of CMOS 65 nm (nanometers) technology, we have $\tau_0$=10 ps (picoseconds), G=40 gigaVolts per meter. Accordingly, a decrease of the voltage $V_{ox\ by}$ only 100 mV will increase the time before breakdown $t_{BD}$ by more than an order of magnitude (×10). A slight reduction of the voltage which will therefore cause degradation of the transistor in a limited manner, will, on the other hand, allow a considerable increasing of the life duration of the transistor.

The idea behind the invention is to allow the measuring of the gate dielectric aging to adapt, if possible, the polarization conditions applied to the transistor as a way of decreasing the stress applied to the dielectric, gradually as it ages. It is a way of establishing a trade-off between degraded transistor performance, typically the switching speed, to the benefit of an increased life duration, by one or even several orders of magnitude.

Measuring the aging of the dielectric is equivalent to evaluating of the leak current in the dielectric. But the gate of a field-effect transistor forms an electrode having a capacity formed with the dielectric (MOS capacity) subsequently referred to as the gate capacity. This intrinsic capacity can be used to evaluate the leak current, by measuring a charge or discharge time of the capacity by this current. This is a great advantage because of its simple implementation and because of the ruggedness of the measurement obtained regarding gate dielectric thickness variations due to technological dispersion. Indeed, as can be read in particular in the document published by Z. Han et al, entitled *"Gate leak current simulation by Boltzman Transport Equation and its dependence on the gate oxide thickness"*, International conference on Semiconductor Processes and devices SISPAD, pp. 247-250, September 1999, the value of this gate capacity varies linearly with the thickness of the dielectric whereas the dielectric leak current varies exponentially with the thickness. In spite of two antagonistic developments, the gate capacity charge or discharge time will indeed increase exponentially with the thickness of the dielectric, corresponding to the reduced stress affecting the dielectric.

By comparison to a reference value, the aging measurement will supply aging information about the dielectric.

Advantageously, it will allow the voltage polarization conditions of the circuit transistor or transistors to be adapted to this aging to reduce the stress affecting the dielectric. The polarization voltage chosen for modification can vary according to the case. In particular, for transistors used in a gate or a logic stage, there is the possibility of choosing the implementation of a gradual decrease of the logic power supply of the integrated circuit, according to the measured aging. For a power transistor, it is possible to choose the implementation of a gradual decreasing of the maximum value (negative or positive) of the gate control voltage, depending on the aging measurement.

Therefore, the invention concerns a test process for increasing the life duration of a field effect transistor in an electronic circuit, embodied wherein it includes:
  a phase of pre-charging the gate of said transistor to a predefined test voltage, then setting the transistor gate to high impedance,
  a phase of aging measurement by means of the charge or discharge time of the gate of the transistor to change from said predefined test voltage level to a reference voltage,
  a stage of determination to decide on maintaining or modifying at least one operational polarization voltage of said transistor, depending on said aging measurement.

The invention also concerns an electronic circuit including at least one field effect transistor, including a circuit measuring the aging of said transistor activated at least on each energising of the electronic circuit, said measuring circuit including:
  means of pre-charging the gate of said transistor with a predefined test voltage, then switching it to high impedance, means of supplying an aging measurement corresponding to the time for charging or discharging the gate with a reference voltage and means of determining at a least one operational polarization voltage of the transistor, depending on said aging measurement.

The invention applies to power transistors as well as to logic circuit transistors as a way of improving the life duration of electronic circuits in reducing the stress applied to the dielectrics of the transistors as soon as aging becomes evident.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DESCRIPTION OF THE PREFERRED EMBODIMENTS

Notations used: Vm and Vdd designate the two logic supply voltage levels of the circuit. Vdd is typically a positive voltage and Vm a zero voltage (0 volt) corresponding by convention to logic levels 1 and 0 respectively. $V_{GN}$ refers to the gate polarization voltage corresponding to the cut-off state of a PMOS transistor. This voltage $V_{GN}$ is typically equal to Vdd, in the case of a logic gate PMOS transistor. It can be a voltage greater than Vdd in the case of a power transistor which is to be cut off in a very particular manner.

The figures or identical parts are identified by the same reference in the figures.

Figure 1A:
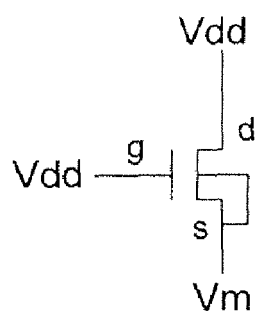
FIGS. 1*a* and 1*b* are symbolic diagrams of an NMOS in the conductive state and in the cut off state.
Figure 1B:
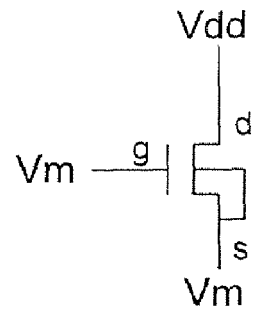
Figure 2:
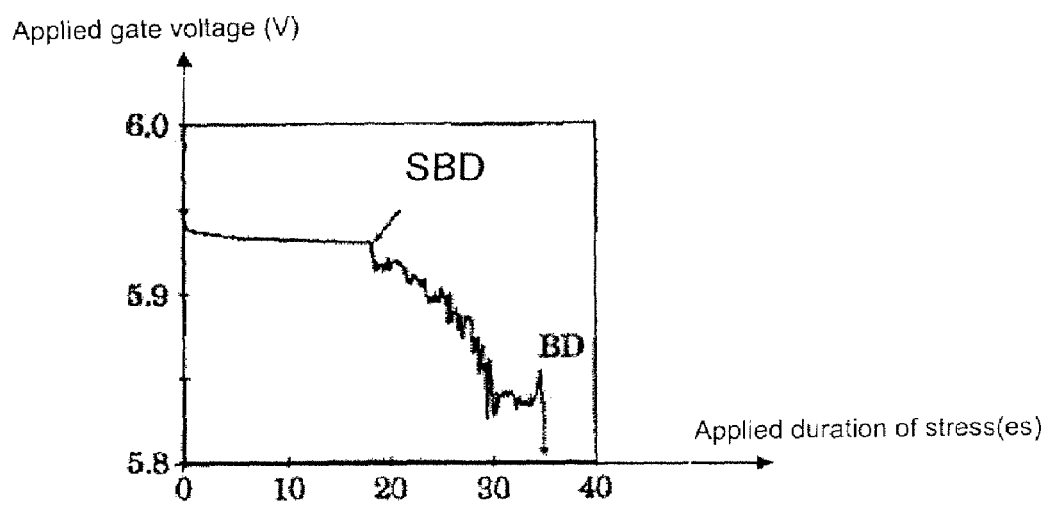
FIG. 2 represents the soft breakdown phenomenon in the thin dielectric of a field effect transistor.
Figure 3:
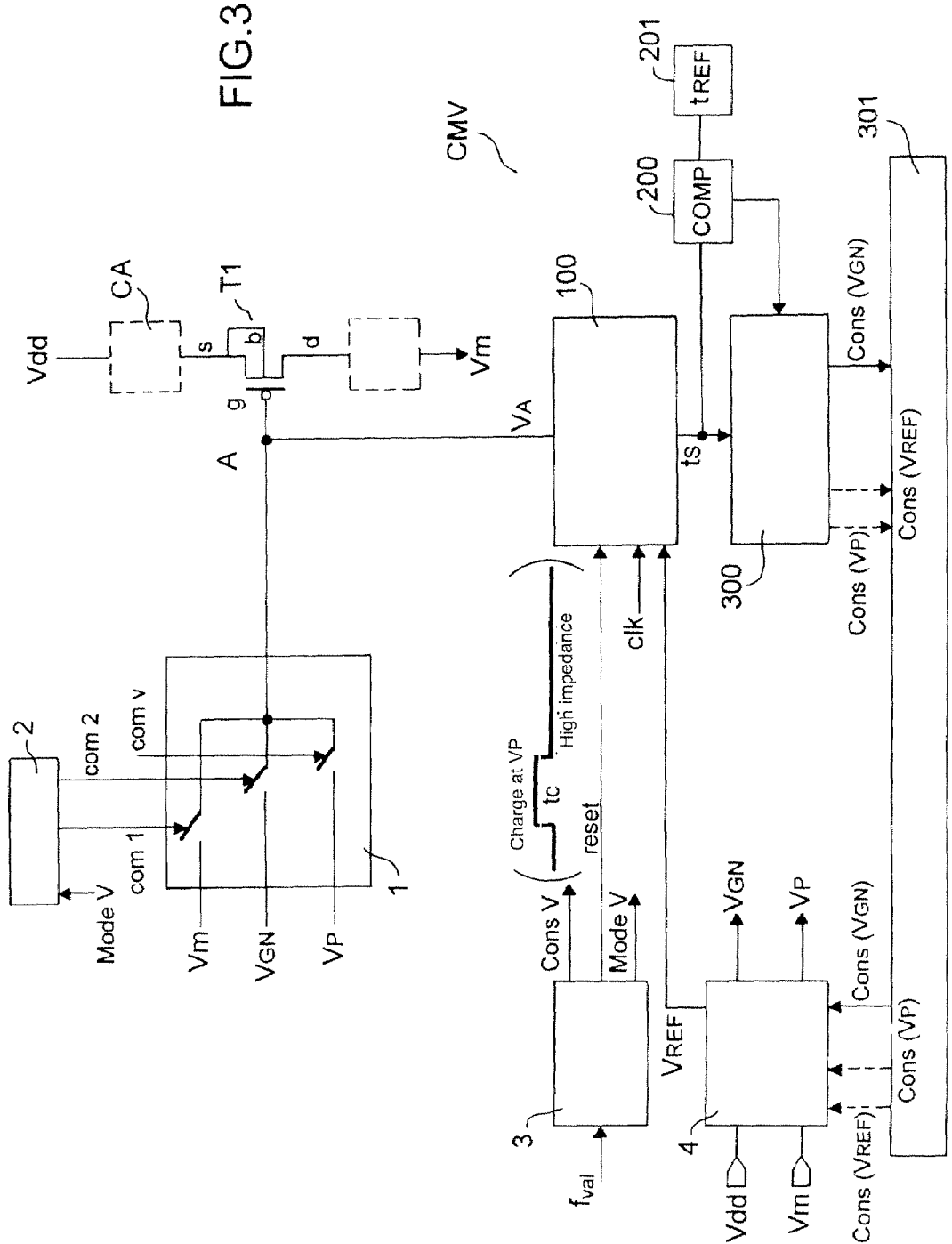
FIG. 3 is a block diagram of a device measuring the aging of a logic circuit field effect transistor.

FIG. 3 illustrates a device measuring the aging of the dielectric of am electric circuit field-effect transistor; in the example, it is a PMOS transistor. Its drain d and its source s are directly or indirectly connected respectively to Vm and Vdd. Substrate or bulk connector b is attached to the source.

A transistor control circuit 1 is used for applying a given voltage to transistor gate g, depending on the control signals it receives, or to leaving the gate at high impedance, that is, not connected. It receives control signals com1, com2 from transistor T1 in electronic circuit operational mode, generated by a logic circuit of the sequencer 2 type. In the example, when control signal com1 is activated, voltage Vm is applied to the transistor gate causing transistor T1 to become conductive; when control signal com2 is activated, voltage $V_{GN}$ is applied to the transistor gate causing the cut-off of transistor T1.

According to the invention, another control signal comv, supplied by a sequencer type logic circuit 3 is provided for, on the activation of the aging test mode (mode V) of the electronic circuit by an activation signal $f_{val}$. In this test mode, operational control nodes com1 and com2 are set to the inactive state at a least until an aging measurement is obtained, for instance, by means of a Mode V test mode signal generated by circuit 3.

Additional control signal comv allows the application of a predefined test voltage $V_P$ to node A connected to the transistor gate, typically for a time tc. Gate node A is then isolated from control circuit 1 and thus changes to high impedance with an initial potential $V_A = V_P$.

An aging measurement circuit 100 has one input connected to node A. It supplies the charge or discharge time measurement of node A, from the pre-charging level $V_P$ to a reference level $V_{REF}$. This node A charge or discharge time depends directly on the leak current in the dielectric of the gate.

If we measure the charge time, we will obtain $V_{REF} > V_P$; if we measure the discharge time, we will obtain $V_{REF} < V_P$.

In practice, the charging or discharging curve depends on the direction of the leak current through the dielectric: it depends on the type of transistor and its polarization conditions. In the example, transistor T1 is a PMOS transistor and the applied polarization voltage $V_P$ corresponds to the cut-off state of the transistor ($V_P \geq Vdd$): the leak current will tend to discharge the gate and the discharge time will be measured. If transistor T1 had been of the NMOS type (in FIG. 3, it would then be necessary to reverse the position of the source s and of the drain d, with substrate or bulk connector b attached to the source), with polarization voltage $V_P$ applied and corresponding to the cut-off state of the transistor ($V_P \leq Vm$): the leak current will tend to charge the gate and the charge time will be measured.

Measurement ts made at the output of measurement circuit 100 can be compared to the charge or discharge time of reference $t_{REF}$.

A parameter 200 at a reference value $t_{REF}$ supplies corresponding aging information:

If $ts \geq t_{REF}$, there are only small leaks meaning that the dielectric is in good condition. It is simply necessary to continue to monitor it.

If $ts < t_{REF}$, the leaks have become greater, meaning that the dielectric has aged.

In practice, the measurement of reference $t_{REF}$ or $N_{REF}$ can be provided by a reference transistor provided on the circuit, supplied only in aging monitoring mode MS. However, the technological manufacturing process is characterised by technological dispersions. This means that the thickness of the reference transistor dielectric may be very different from the nominal value. In the particular case of it being rather finer than the nominal thickness characteristic of the technology in question, the reference transistor leak current will be too high and the determination of a new setpoint based on comparison with such a reference transistor would have the opposite effect to the effects desired.

As a measurement reference, a measurement made originally on a transistor gate whose aging is to be monitored could be used. But once again this will depend on technological dispersions.

It would be better to consider a reference measurement $t_{REF}$ corresponding to a dielectric that has not aged at the nominal values of the technology and in particular at a nominal thickness. Typically, this measurement will be determined during the manufacturing of the circuit and stored in a non-volatile memory cell, typically a memory cell ROM 201 (FIG. 3) of the electronic circuit.

The aging information supplied by comparator 200 is used to good advantage to decrease the stress on the dielectric by modifying the transistor polarization conditions.

Circuit 300 is designed to evaluate the polarization setpoint levels illustrated in FIG. 3. Depending on the measured value ts, this circuit supplies at least one transistor operational polarization setpoint in order to reduce the applied stress. In the illustrated example, circuit 300 supplies a polarization voltage set point which is operational in the cut-off state $V_{GN}$, identified as cons ($V_{GN}$), by means of which the voltage $V_{GN}$ will be modified accordingly.

This can be done, for instance, through stage 4 generating the voltages needed, generally provided for in an electronic circuit. For example, if the level of voltage $V_{GN}$ applied operationally, is a logic level, that is equal to Vdd in the example, we arrange for a voltage generation stage 4 to include a voltage converter at a digital control input of which the set point cons ($V_{GN}$) will be applied. At the output we obtain a corresponding voltage $V_{GN}$ whose level will be slightly lower than the nominal value of voltage Vdd, depending on the required setpoint, for instance, less than 50 millivolts.

In the event of the level of voltage $V_{GN}$ applied operationally being of the "analogue" type that is greater than Vdd, this voltage $V_{GN}$ can be supplied either by an external power supply signal or by a charge pump. In this case we ensure the application of the setpoint cons($V_{GN}$) to a digital control input either of a converter associated with the external supply signal, or of the charge pump to obtain an output voltage $V_{GN}$ conforming to the setpoint.

To continue to apply the setpoints generated by circuit 300, in step with its continuous aging, after the deenergising of the electronic circuit, they have to be memorised in a programmable non-volatile memory cell 301. This can be particularly demanding, especially in terms of cost, because the technological steps involved in manufacturing programmable non-volatile memory cells, for instance flash memories, are not easy to integrate into a fast logic electronic circuit. This leads to a compromise between the different advantages: better follow up, optimised life duration, and of various drawbacks: cost (additional space, technological integration).

To overcome this constraint, arrangements can be made to activate the aging test mode systematically each time the electronic circuit is switched back on, to determine the applicable setpoints.

Note that it is not mandatory to ensure comparison of 200 with a reference value tREF to activate circuit 300. Indeed, it is possible to apply directly the aging measurement ts to setpoint evaluation circuit 300 which, at the output, will supply setpoints corresponding to the optimal initial conditions of the integrated circuit until any aging is detected.

Figure 4:
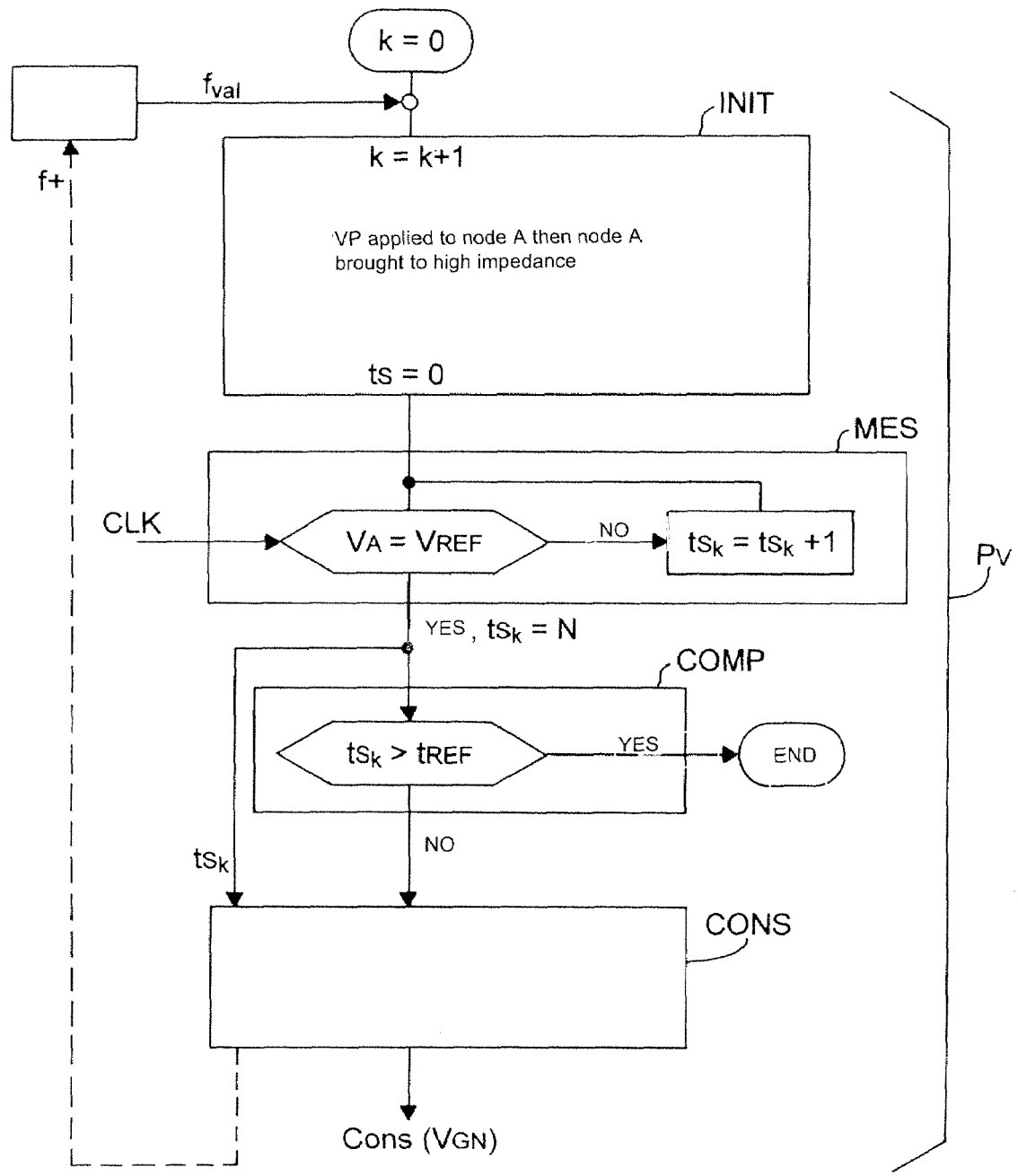
FIG. 4 is a flowchart corresponding to a process according to the invention.

The flowchart of FIG. 4 illustrates this aging test process PV which we have just explained. Accordingly, the process includes essentially an initialisation phase INIT with precharging at VP then the setting to high impedance of gate node A; an aging measurement phase MES of the charge or discharge time ts of node A (circuit 300, FIG. 3); a determination phase DET, including a setpoint evaluation phase CONS (Circuit 300, FIG. 3) and possibly, prior comparison phase COMP (Circuit 200, FIG. 3). This test process can be activated at least once, systematically on energising, by the activation of a corresponding signal $f_{val}$.

For more thorough monitoring, the aging test PV CAN be activated periodically, for instance every 100 hours, for a projected electronic circuit life of 100,000 hours.

In one improvement, steps are taken to adapt the test activation frequency to the observed level of aging. Typically, if the dielectric degradation rate decreases, we increase the test activation frequency (f+), to slow down for the best the aging process. This entails being able to preserve the successive values $ts_k$ on the charging or discharging time measurement in the non-volatile memory to preserve these values even between two power supply cut-offs. We have seen that this option can be costly.

Figure 5:
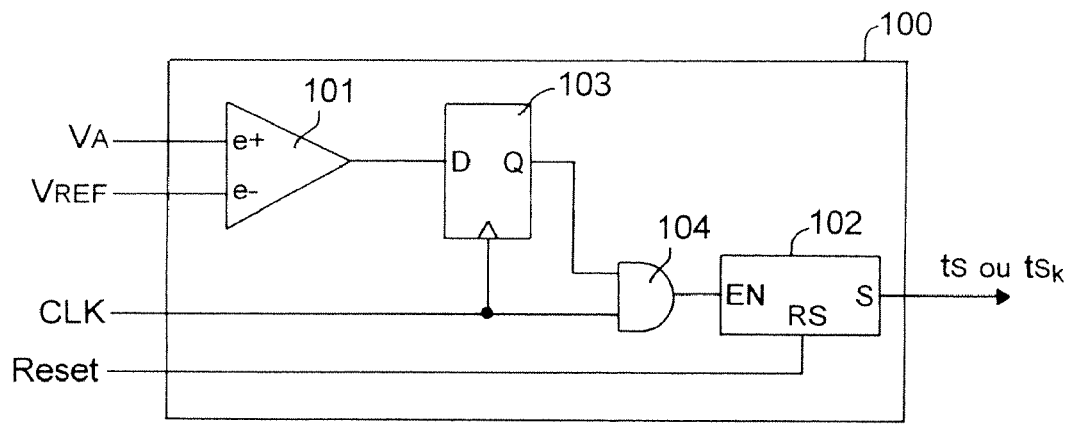
FIG. 5 illustrates an example of the design of a circuit measuring the charge or discharge time of a transistor gate node.

FIG. 5 illustrates a typical embodiment of measurement circuit 100 of the charge or discharge time ts. It includes a voltage comparator 101, whose first input e+ is connected to the gate and which on its second input e−, receives reference voltage VREF; a counter 102, which is reinitialized on each new activation of the test ($f_{val}$) by a Reset signal and which will then be incremented by one unit on each stroke of clock CLK provided that node A voltage VA is not equal to VREF. Logic gates are provided to control the counter in an appropriate manner. In the example, the output of the comparator is set to 1 until equality has been verified, then changes to zero once it has been checked. A D 102 type flip-flop and an AND gate 103 are then used to combine appropriately the compara-tor output with the clock pulse and supply the implementation signal at the corresponding input EN of the counter. At the end of evaluation, the counter outputs a number N of clock strokes which represent measurement ts of the charge or discharge time in the course of the test. This number N can be compared (200, FIG. 3) with a number NREF corresponding to the measurement of reference time tREF of the charge or discharge time of a corresponding un-aged dielectric.

Circuit 300 generating the setpoint can be a conversion table bringing each value of N (ts), to correspond to a digital value forming the corresponding setpoint. In this case, a conversion table is predefined in advance and integrated into the electronic circuit. It can include, in practice, a multitude of setpoints each of which corresponds to a value N, or a range of values $N1 \leq N \leq N2$.

Figure 6:
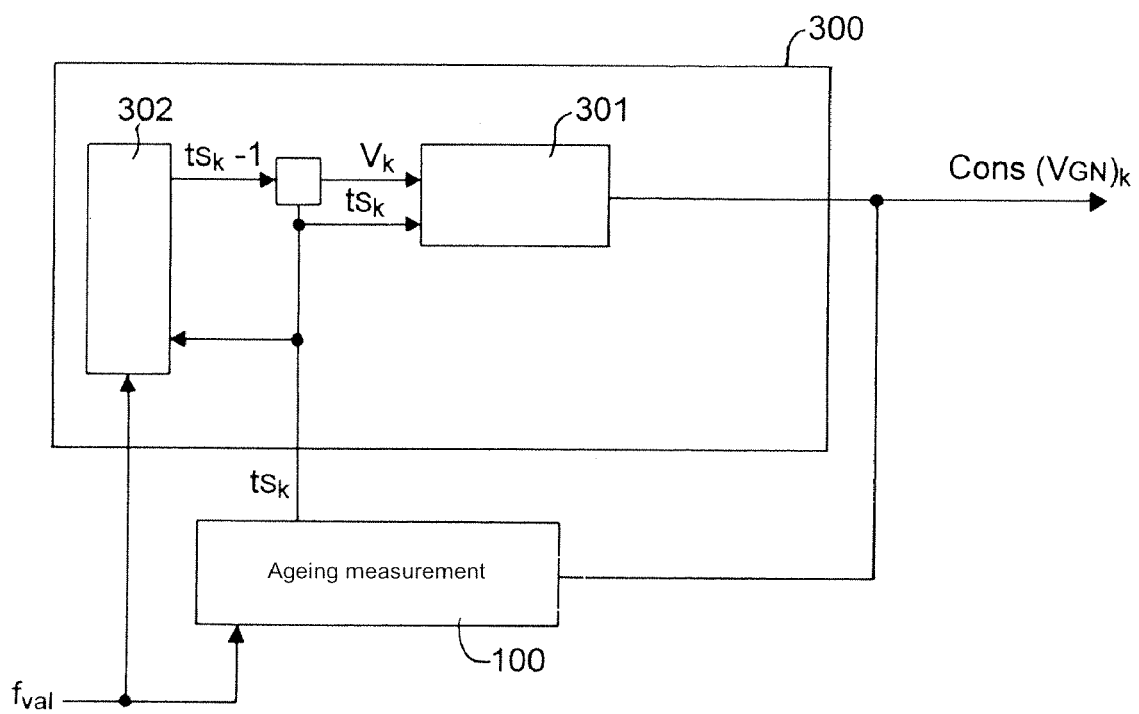
FIG. 6 illustrates an example of the design of a circuit generating a setpoint with slaving to reduce the stress applied to the dielectric of a transistor gate.

The set point generation circuit can be more elaborate and as shown in FIG. 6, utilize digital slaving 301 to generate a set point according to the rate of degradation of the dielectric $v_k$, calculated typically on the basis of current measured value $ts_k$ ($N_k$) and of the previously memorized measurement values $ts_{k-1}$ ($N_{k-1}$), . . . . Each time the aging monitoring mode is activated, the measurement tSK SUPPLIED by measurement circuit 100 must be memorized in a memory type 302. In this way, aging can be characterised in the course of time and the slaving loop 301 will tend to stop this development.

Memory 302 has to be programmable and non-volatile to be preserved when there is no electric power supply. We have already seen that this can be a constraint, especially in terms of the cost. On the other hand, it is possible to obtain fine adaptation of the stress.

In an alternative embodiment of the invention and as illustrated in dotted lines in FIG. 3, it is arranged so that test voltage VP is itself modified gradually in the course of aging so that the aging test does not induce additional stress on the dielectric whereas in operational mode, this stress has been reduced. In this way it may be advisable to predefine a multitude of test voltage values VP, depending on the aging. This may also lead to changing the voltage value of the reference VREF. In this case, the determination step DET of FIG. 4 includes a phase of determining the test voltage VP to be applied to a forthcoming measurement according to the current aging measurements made.

In one example of implementation, we provide for the use of a multitude of predefined conversion tables; it is possible to have one per test voltage value. Each table supplies for a given aging measurement value, or for a range of values, a set of corresponding setpoints, also including operational polarization voltage setpoints (Cons(VGN)), a test voltage setpoint Cons(VP), and even a reference voltage setpoint Cons(VREF). If we refer to the example of FIG. 3, all these setpoints will be applied to the digital input of the corresponding voltage converters or charge pumps, to each generate a corresponding voltage value. Since these are operational polarization voltage set points (Cons (VGN)) they will apply immediately. The test voltage set point Cons (VP), and possibly the reference voltage set point Cons (VREF) will apply for the next aging measurement.

An aging test according to the invention may be applied advantageously to a power transistor in the analogue stage of an integrated electronic circuit, for incidents in a power transistor interposed in series between the power supply terminal Vdd of the integrated electronic circuit and an active part of circuit (CA), in order to supply power to the active part CA in an active mode, or to de-energise it in a stand-by mode.

If we refer to FIG. 3, operation will be as follows: —in the active mode, corresponding to control signal com1: the transistor will be rendered highly conductive and allow conduction of all the current needed for the active circuit with a minimum voltage drop and therefore without any pointless consumption of power;

in the standby mode, corresponding to control signal com2:
It is cut off to interrupt the current from the power supply source towards the remainder of the integrated circuit by inverse gate super-polarization. In this case, voltage $V_{GN}$ equals a Vcc voltage greater than the logic voltage Vdd, supplied by the integrated charge pump or by a power supply outside the electronic circuit. In one example, voltage Vdd can be 1.2 V, the standard for small portable devices, and voltage $Vcc^{CAN}$ be 2.5 volts.

In an example like this, the level of test voltage $V_P$ being used will correspond typically to a level close to or equal to the $V_{GN}$ level of the gate applied to the transistor in the standby mode, at the origin of the stress. In practice, this voltage can be produced by a charge pump integrated into the electronic circuit or supplied externally.

In reality, it will be noted that the test voltage $V_P$ applied will generally not be directly the $V_{GN}$ voltage. Indeed, in the case of a power transistor, the $V_{GN}$ voltage applied in operational mode can vary to obtain the lowest possible leak current according to the changing environmental conditions, for instance the temperature. But to characterise aging, it is necessarily important to be able to recharge the gate of the transistor in question to a value of $V_P$, set in the course of time, so that the various measurements are consistent.

In an example of practical application in this way, the invention will gradually decrease the operational voltage level of voltage $V_{GN}$ at the origin of the stress, gradually in step with the measured aging. Depending on the applications, it may be considered more generally desirable to modify the transistor voltage polarization conditions, that is, including the voltages applied to the drain and the source, or of the voltage applied in the conducting mode.

Preferably, test voltage $V_P$ and the modified polarization voltage conditions (especially $V_{GN}$) correspond to a transistor in the cut-off state.

Figure 7:
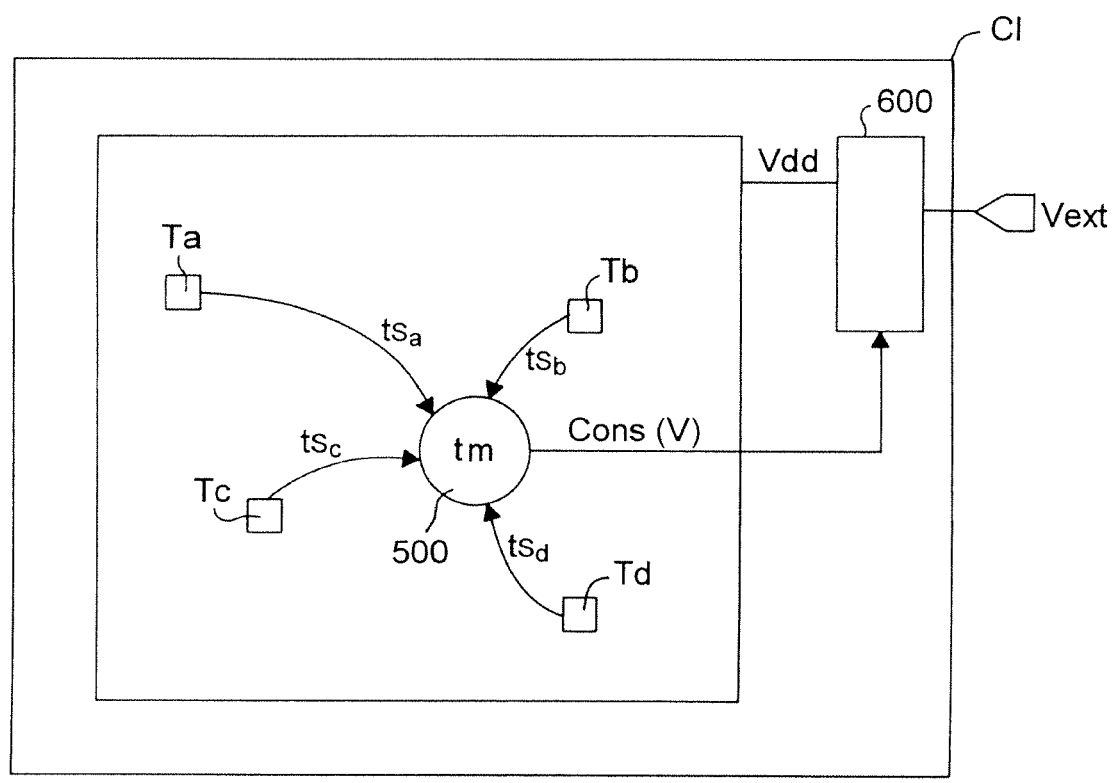
FIG. 7 is a simplified diagram of a logic circuit consisting of transistors indicating dispersed aging and an associated device for monitoring the aging of the logic circuit and reducing the stress, where applicable, by adapting the logic supply voltage levels.

FIG. 7 illustrates another example of the application of the invention to decrease the stress in the field effect transistors used in logic gates or circuits. If we refer to FIG. 3 again, it corresponds to the case in which the $V_{GN}$ level corresponds to logic level Vdd.

It is then a matter of characterising the aging of the entire integrated circuit CI and adapting accordingly and directly the voltage level of logic power supply Vdd. To be able to characterise the aging of the entire circuit, it is advantageous to have reference transistors Ta, Tb, Tc, Tb geographically dispersed on the circuit in order to overcome any technological dispersion. In this case we provide for means 500 of obtaining a measurement of the charge or discharge time of each of the transistors and characterizing an average degradation from these measurements tsa, tsb, tsc, tsd, to generate the corresponding set point Cons (V). This set point is applied, for instance, to the input of a digital converter 600 which will make it possible either to maintain the voltage level of the power supply voltage Vdd of the electronic circuit, as long as no aging is observed, or to adapt the level of the power supply voltage Vdd of the electronic circuit to the observed aging. The applied test voltage preferably corresponds to a cut-off transistor. It can be arranged for the same measurement circuit 500 to run various measurements tsa, tsb, tsc, tsd, and work out their average tm, to supply the set point Cons (V).

In practice, in this example of the application of the invention to the following up of a circuit supplied at nominal voltage, the test voltage $V_P$ can be simply the power supply voltage Vdd.

All the variants described with respect to FIGS. 3 to 6, especially for obtaining the reference value, generating the setpoint, adapting the test and reference voltages to the aging of the integrated circuit, apply in the same way here.

The invention is a way of maintaining an electronic circuit under optimal operating performance conditions, as long as there is no evidence of aging. In the event of aging, performances will be slightly degraded and increase the life duration by more than one order of magnitude.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by the definition contained in the appended claims and equivalent thereof.

The invention claimed is:

1. A test process for increasing the life duration of a field effect transistor in an electronic circuit, comprising the steps of:
    precharging a gate of a transistor to a predefined test voltage $V_P$, then setting the transistor gate to a high impedance,
    measuring aging by measuring a charge or discharge time of the gate of said transistor to change from said predefined test voltage level to a reference voltage, and
    determining whether to maintain or modify an operational polarization voltage of said transistor, depending on said aging measurement.

2. The process according to claim 1, wherein said determining steps includes the application of said aging measurement to the input of a conversion table supplying at the output at least one corresponding operational polarization voltage set point.

3. The process according to claim 1, wherein each aging measurement is stored in a non-volatile memory and in that the determining step includes slaving at an aging degradation rate calculated from the memorized aging measurement and the current measurement to supply at least one operational polarization voltage set point.

4. The process according to claim 3, wherein said aging measurement is performed by a counter initialized on each new measurement phase and incremented or decremented on each stroke of a clock, provided that gate voltage is not equal to said reference voltage.

5. The process according to claim 1, wherein the determining stage includes the determination of the test voltage to be applied to a forthcoming measurement depending on said aging measurement.

6. The process according to claim 5, wherein the determination of the transistor operational polarization voltage depends on the current aging measurement and the test voltage applied in the corresponding measurement phase.

7. The process according to claim 2, wherein the determination of the transistor operational polarization voltage depends on the current aging measurement and the test voltage applied in the corresponding measurement phase.

8. The process according to claim 6, wherein for each test voltage value, there is a corresponding and determined reference voltage.

9. The process according to claim 1, wherein said test and operational polarization voltages correspond to a cut-off transistor.

10. The process according to claim 1, wherein it is activated periodically at an activation frequency.

11. The process according to claim 10, wherein said activation frequency increases with the aging.

12. The process according to claim 1, including a comparison step measuring the aging against a reference value, to supply the corresponding aging information.

13. The process according to claim 12, wherein the reference value corresponds to an un-aged transistor dielectric with a nominal thickness.

14. An electronic circuit including at least one field-effect transistor, wherein it includes a circuit measuring the aging of said transistor activated at least on each energising of the electronic circuit, said measuring circuit including:
    means for pre-charging the gate of said transistor with a predefined test voltage $V_P$, then switching it to high impedance, means for supplying an aging measurement corresponding to the time for charging or discharging the gate with a reference voltage and means for determining at a least one operational polarization voltage of the transistor, depending on said aging measurement.

15. The electronic circuit according to claim 14, including a multitude of field effect transistors dispersed on the circuit and polarized under normal voltage conditions corresponding to the logic supply circuit of said circuit and at a least one aging measurement circuit for measuring the aging of each of said transistors, and modifying where applicable, the logic supply voltage of the circuit according to the average of said measurements.

16. The electronic circuit according to claim 14, including at a least one field effect power transistor, in which an aging measurement circuit is associated with said power transistor to adapt the voltage polarization conditions of said power transistor according to said measurement.

17. The electronic circuit according to claim 14, wherein said test voltage and said polarization conditions correspond to a cut-off transistor.

18. The process according to claim 7, wherein it includes the use of several conversion tables, one per possible test voltage value possible, and wherein, for each new measurement phase, the conversion table corresponding to the test voltage value applied in said measuring step is selected.

19. The electronic circuit according to claim 15, wherein said test voltage and said polarization conditions correspond to a cut-off transistor.

20. The electronic circuit according to claim 16, wherein said test voltage and said polarization conditions correspond to a cut-off transistor.

* * * * *